(12) United States Patent
Zhu et al.

(10) Patent No.: US 8,829,621 B2
(45) Date of Patent: Sep. 9, 2014

(54) SEMICONDUCTOR SUBSTRATE FOR MANUFACTURING TRANSISTORS HAVING BACK-GATES THEREON

(75) Inventors: Huilong Zhu, Poughkeepsie, NY (US); Zhijiong Luo, Poughkeepsie, NY (US); Haizhou Yin, Poughkeepsie, NY (US); Huicai Zhong, San Jose, CA (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 50 days.

(21) Appl. No.: 13/696,995

(22) PCT Filed: Nov. 29, 2011

(86) PCT No.: PCT/CN2011/001993
§ 371 (c)(1),
(2), (4) Date: Nov. 8, 2012

(87) PCT Pub. No.: WO2013/033876
PCT Pub. Date: Mar. 14, 2013

(65) Prior Publication Data
US 2013/0200456 A1    Aug. 8, 2013

(30) Foreign Application Priority Data
Sep. 7, 2011    (CN) .......................... 2011 1 0263458

(51) Int. Cl.
*H01L 21/70* (2006.01)
*H01L 27/12* (2006.01)
*H01L 21/84* (2006.01)
*H01L 27/092* (2006.01)
*H01L 21/74* (2006.01)
*H01L 21/762* (2006.01)
*H01L 29/786* (2006.01)

(52) U.S. Cl.
CPC ............ *H01L 27/12* (2013.01); *H01L 27/1203* (2013.01); *H01L 21/84* (2013.01); *H01L 27/092* (2013.01); *H01L 21/743* (2013.01); *H01L 21/762* (2013.01); *H01L 29/78648* (2013.01)
USPC ........................................................ 257/369

(58) Field of Classification Search
USPC .............. 257/43, 324, 29, 296, 369, E27.112, 257/347, E27.103
See application file for complete search history.

(56) References Cited

U.S. PATENT DOCUMENTS 6,740,551 B2    5/2004    Yoshida et al. ............... 438/199
6,979,846 B2    12/2005   Yagishita et al. ............. 257/288

(Continued)

FOREIGN PATENT DOCUMENTS
JP    10-41512 A     2/1998    ............ H01L 29/786
JP    10-308515 A    11/1998   ............ H01L 29/786

*Primary Examiner* — Bilkis Jahan
(74) *Attorney, Agent, or Firm* — Martine Penilla Group, LLP

(57) ABSTRACT

The present invention relates to a semiconductor substrate, an integrated circuit having the semiconductor substrate, and methods of manufacturing the same. The semiconductor substrate for use in an integrated circuit comprising transistors having back-gates according to the present invention comprises: a semiconductor base layer; a first insulating material layer on the semiconductor base layer; a first conductive material layer on the first insulating material layer; a second insulating material layer on the first conductive material layer; a second conductive material layer on the second insulating material layer; an insulating buried layer on the second conductive material layer; and a semiconductor layer on the insulating buried layer, wherein at least one first conductive via is provided between the first conductive material layer and the second conductive material layer to penetrate through the second insulating material layer so as to connect the first conductive material layer with the second conductive material layer, the position of each of the first conductive vias being defined by a region in which a corresponding one of a first group of transistors is to be formed.

19 Claims, 7 Drawing Sheets

(56) References Cited

U.S. PATENT DOCUMENTS

| | | | |
|---|---|---|---|
| 8,541,819 B1* | 9/2013 | Or-Bach et al. | 257/211 |
| 2002/0063286 A1* | 5/2002 | Wu et al. | 257/347 |
| 2003/0054594 A1 | 3/2003 | Yoshida et al. | 438/154 |
| 2003/0209761 A1 | 11/2003 | Yagishita et al. | 257/347 |
| 2007/0132011 A1 | 6/2007 | Kato et al. | 257/324 |
| 2009/0256199 A1* | 10/2009 | Denison et al. | 257/343 |

* cited by examiner

SEMICONDUCTOR SUBSTRATE FOR MANUFACTURING TRANSISTORS HAVING BACK-GATES THEREON

CLAIM OF PRIORITY

This application is a Section 371 National Stage Application of International Application No. PCT/CN2011/001993, filed on Nov. 29, 2011, which claims priority to Chinese Application No. CN201110263458.2, filed on Sep. 7, 2011 entitled "Semiconductor Substrate, Integrated Circuit Having the Semiconductor Substrate, and Methods of Manufacturing the Same", the entire contents of which are incorporated herein by reference in their entirety.

FIELD OF THE INVENTION

The present invention relates to the field of semiconductor fabrication, and more particularly, to a semiconductor substrate, an integrated circuit having the semiconductor substrate, and methods of manufacturing the same.

BACKGROUND OF THE INVENTION

Generally, an integrated circuit (IC) includes a combination of an NMOS (n type Metal-Oxide-Semiconductor) transistor and a PMOS (p type Metal-Oxide-Semiconductor) transistor formed on a substrate. In order to increase the efficiency of the very large scale integrated circuits and to reduce the manufacturing costs thereof, a continuous trend is to reduce the feature size of the device, especially the length of the gate electrode. However, the reduction in the length of the gate electrode will result in a short-channel effect, thus degrading the performance of the semiconductor device and the whole integrated circuit.

The Silicon-On-Insulator (SOI) technique is to introduce a buried oxide layer (BOX) between the top layer silicon and the back substrate. The existence of the buried oxide layer enables a complete dielectric isolation among elements in the integrated circuit, so the SOI-CMOS integrated circuit substantially avoids the parasitic latch-up effect in the bulk silicon CMOS circuit. Meanwhile, the complete depletion type SOI device has a small short-channel effect, can naturally form a shallow junction and has a small leakage current. Therefore, the complete depletion SOI-MOSFET having an ultrathin SOI and dual gates have attracted wide attention. In order to adjust the threshold voltage and to suppress the short-channel effect, a ground plane, which is sometimes used for connecting to the semiconductor layer, is formed under the ultrathin oxide buried layer in the SOI-MOSFET device, and the ground plane is made to have a low resistance so as to form a back-gate structure of the transistor. However, according to conventional methods, in order to connect the ground planes of the NMOSFET and PMOSFET to the respective voltage sources, extra contacts and wirings are needed, resulting in an increase in the area occupied by the device.

Hence, there is a need for an improved method to connect the ground planes of the NMOSFET and PMOSFET to the respective voltage sources to reduce the area occupied by the device.

SUMMARY OF THE INVENTION

An object of the present invention is to provide an improved semiconductor substrate, an integrated circuit having the semiconductor substrate, and methods of manufacturing the same, so that it is unnecessary to separately provide for each transistor a contact for the back-gate when manufacturing the integrated circuit, thereby reducing the area occupied by the transistors.

To achieve the above object, according to a first aspect of the present invention, a semiconductor substrate is provided for manufacturing transistors having back-gates thereon. The semiconductor substrate comprises: a semiconductor base layer; a first insulating material layer on the semiconductor base layer; a first conductive material layer on the first insulating material layer; a second insulating material layer on the first conductive material layer; a second conductive material layer on the second insulating material layer; an insulating buried layer on the second conductive material layer; and a semiconductor layer on the insulating buried layer, wherein at least one first conductive via is provided between the first conductive material layer and the second conductive material layer to penetrate through the second insulating material layer so as to connect the first conductive material layer with the second conductive material layer, the position of each of the first conductive vias being defined by a region in which a corresponding one of a first group of transistors is to be formed.

According to a second aspect of the present invention, a semiconductor substrate is provided for manufacturing transistors having back-gates thereon. The semiconductor substrate, in addition to having the same structure as the semiconductor substrate according to the first aspect of the present invention, further comprises: a plurality of first isolation structures, the bottom surfaces of the first isolation structures being flushed with the lower surface of the second insulating material layer and the top surfaces of the first isolation structures being flushed with or slightly higher than the upper surface of the semiconductor layer, wherein each of the areas in which transistors having back-gates are to be formed is defined by adjacent first isolation structures.

According to a third aspect of the present invention, a semiconductor substrate is provided for manufacturing transistors having back-gates thereon. The semiconductor substrate, in addition to having the same structure as the semiconductor substrate according to the first aspect of the present invention, further comprises: another conductive material layer between the first insulating material layer and the first conductive material layer; and another insulating material layer between the another conductive material layer and the first conductive material layer, wherein a plurality of second conductive vias are provided between the second conductive material layer and the another conductive material layer to penetrate through the another insulating material layer, the first conductive material layer and the second insulating material layer so as to connect the second conductive material layer with the another conductive material layer, the second conductive vias being electrically insulated from the first conductive material layer; and wherein the plurality of second conductive vias are divided into a first group and a second group, the first group including one second conductive via, and each of the second conductive vias in the second group is defined by a region in which a corresponding one of transistors of a second conductive type is to be formed.

According to a fourth aspect of the present invention, a semiconductor substrate is provided for manufacturing transistors having back-gates thereon. The semiconductor substrate, in addition to having the same structure as the semiconductor substrate according to the third aspect of the present invention, further comprises: a plurality of first isolation structures, the bottom surfaces of the first isolation structures being flushed with the lower surface of the second insulating material layer and the top surfaces of the first isolation structures being flushed with or slightly higher than the upper surface of the semiconductor layer, wherein each of the areas in which transistors having back-gates are to be formed is defined by adjacent first isolation structures.

According to a fifth aspect of the present invention, an integrated circuit is provided, which, in addition to comprising the semiconductor substrate according to the second aspect of the present invention, further comprises: transistors located in a region in which transistors having back-gates are to be formed, the transistors comprising a first group of transistors and a second group of transistors, the conductive channels of the transistors being in the semiconductor layer and the back-gates of the transistors being formed from the second conductive material layer; a dielectric layer covering the semiconductor substrate and the transistors; and a conductive contact for electrically connecting the back-gates of the first group of transistors to outside by electrically connecting the first conductive material layer to outside.

According to a sixth aspect of the present invention, an integrated circuit is provided, which, in addition to comprising the semiconductor substrate according to the fourth aspect of the present invention, further comprises: transistors located in a region in which transistors having back-gates are to be formed, the transistors comprising a first group of transistors and a second group of transistors, the conductive channels of the transistors being in the semiconductor layer and the back-gates of the transistors being formed from the second conductive material layer; a dielectric layer covering the semiconductor substrate and the transistors; a first conductive contact for electrically connecting the back-gates of the first group of transistors to outside by electrically connecting the first conductive material layer to outside; and a second conductive contact penetrating through the dielectric layer, the semiconductor layer, and the insulating buried layer to reach the second conductive material layer so as to be electrically connected with the first group of transistors.

According to a seventh aspect of the present invention, a method of manufacturing a semiconductor substrate is provided, the semiconductor substrate being used for manufacturing transistors with back-gates thereon. The method comprises the steps of: providing a semiconductor base layer; sequentially forming a first insulating material layer, a first conductive material layer and a second insulating material layer on the semiconductor base layer; patterning the second insulating material layer to form at least one through hole penetrating through the second insulating material layer, the position of each of the through holes being defined by a region in which a corresponding one of the first group of transistors are to be formed; depositing a conductive material on the second insulating material layer to form a second conductive material layer, so that each of the through holes is filled up with the conductive material of the second conductive material layer to form a conductive via; depositing an insulating buried layer on the second conductive material layer; and forming a semiconductor layer on the insulating buried layer.

According to an eighth aspect of the present invention, a method of manufacturing a semiconductor substrate is provided, the semiconductor substrate being used for manufacturing transistors with back-gates thereon. The method comprises the steps of: providing a semiconductor base layer; sequentially forming a first insulating material layer, a first conductive material layer and a second insulating material layer on the semiconductor base layer; patterning the second insulating material layer to form a plurality of first through holes penetrating through the second insulating material layer, the first through holes being divided into a first group and a second group, wherein the first group includes one first through hole, and the position of each of the first through holes in the second group is defined by a region in which a corresponding one of the first group of transistors are to be formed; depositing a conductive material on the second insulating material layer to form a second conductive material layer, so that each of the first through holes is filled up with the conductive material of the second conductive material layer to form a plurality of first conductive vias; patterning the second conductive material layer, so that at least a part of each of the first conductive vias is covered by a part of the second conductive material layer, and that the part of the second conductive material layer covering at least a part of each of the first conductive vias is separated from other parts of the second conductive material layer; depositing an insulating material on the second conductive material layer to form a third insulating material layer, so that the insulating material of the third insulating material layer fills up the space between the separated parts of the second conductive material layer; patterning the third insulating material layer, so that part of the second conductive material layer remaining above the first conductive vias is exposed and that a plurality of second through holes are formed, the position of each of the second through holes being defined by a region in which a corresponding one of the second group of transistors are to be formed; depositing a conductive material on the third insulating material layer to form a third conductive material layer, so that the second through holes are filled up with the conductive material of the third conductive material layer to form second conductive vias, and that the exposed part on the second conductive material layer remaining above the first conductive vias is filled up with the conductive material of the third conductive material layer to form a third conductive via; depositing an insulating buried layer on the third conductive material layer; and forming a semiconductor layer on the insulating buried layer.

According to a ninth aspect of the present invention, a method of manufacturing a semiconductor substrate is provided, the semiconductor substrate being used for manufacturing transistors with back-gates thereon. The method, in addition to comprising the steps according to the eighth aspect of the present invention as described above, further comprises: forming a plurality of first isolation structures, the bottom surfaces of the first isolation structures being flushed with the lower surface of the second insulating material layer, and the top surfaces of the first isolation structures being flushed with or slightly higher than the upper surface of the semiconductor layer, wherein each of the areas in which transistors having back-gates are to be formed is defined by adjacent first isolation structures.

By using the semiconductor substrate manufactured by the method according to the present invention, it is unnecessary to separately provide for each transistor a conductive contact for the back-gate in the subsequent process of manufacturing the integrated circuit. Instead, the back-gates of at least some transistors can be connected, through the corresponding conductive vias, to a common interconnection layer, and the common interconnection layer can be connected to outside through one contact. Thus the area occupied by at least some transistors can be greatly reduced, which accordingly increases the utilization ratio of the wafer. In a preferred embodiment, the back-gates of all nMOSFETs are connected, via one conductive contact, to outside through a common interconnection layer, while the back-gates of all pMOSFETs are connected, via another conductive contact, to outside through another common interconnection layer. Hence, only two contacts for the back-gates need to be formed on the whole integrated circuit, which greatly increases the utilization ratio of the wafer.

The features and advantages of the present invention will become more apparent by reading the detailed description given below with reference to the drawings.

DETAILED DESCRIPTION OF THE PREFERRED EMBODIMENTS

The exemplary embodiments of the present invention will be described in detail below with reference to the drawings. The drawings are schematic and are not drawn to scale, and they only intend to illustrate the embodiments of the present invention rather than limiting the protection scope of the present invention. Throughout the drawings, the same or similar reference numbers represent the same or similar elements. To make the technical solution of the present invention clearer, the process steps and devices known in the art are omitted herein. In addition, in the context of this description, one layer being on another layer includes both of the case in which the two layers are in direct contact and the case in which other layers or elements are inserted between the two layers.

First Embodiment

Figure 1:
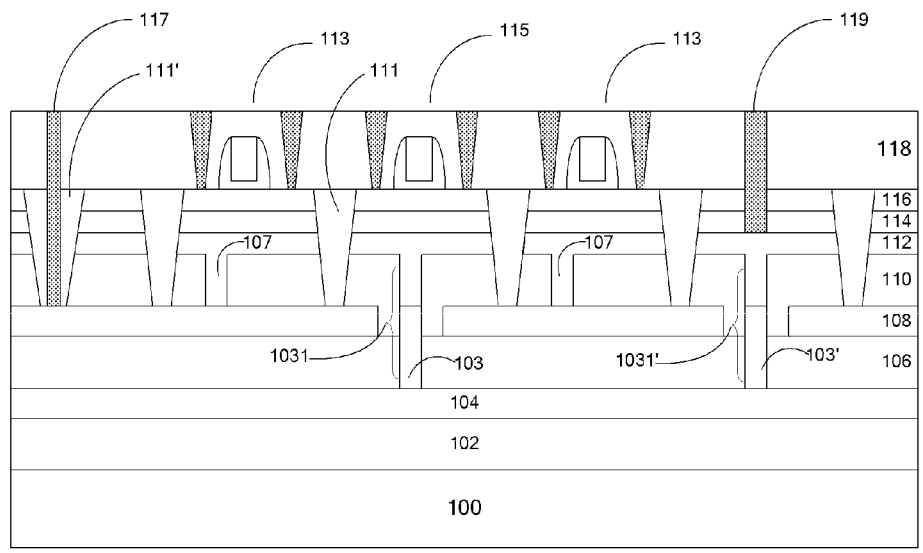
FIG. 1 schematically shows a cross-sectional view of an integrated circuit comprising transistors having back-gates according to a first embodiment of the present invention.

FIG. 1 shows a schematic cross-sectional view of an integrated circuit 10 comprising transistors having back-gates according to a first embodiment of the present invention.

The integrated circuit 10 comprises: a semiconductor base layer 100; a first insulating material layer 102 on the semiconductor base layer 100; a first conductive material layer 104 on the first insulating material layer 102; a second insulating material layer 106 on the first conductive material layer 104; a second conductive material layer 108 on the second insulating material layer 106; a third insulating material layer 110 on the second conductive material layer 108; a third conductive material layer 112 on the third insulating material layer 110; an insulating buried layer 114 on the third conductive material layer 112; a semiconductor layer 116 formed on the insulating buried layer 114.

The integrated circuit 10 further comprises vias 107 penetrating through the third insulating material layer 110 to electrically connect the second conductive material layer 108 with the third conductive material layer 112. The vias 107 are located under areas in which corresponding transistors are to be formed. The integrated circuit 10 further comprises vias penetrating through the third insulating material layer 110, the second conductive material layer 108 and the second insulating material layer 106 to electrically connect the third conductive material layer 112 with the first conductive material layer 104. The vias are divided into a first group of vias 1031 and a second group of vias 1031'. The second group of vias 1031' includes one via, and the first group of vias 1031 is located under a region in which a corresponding transistor is to be formed. At a region where the vias 1031 and 1031' penetrate through the second conductive material layer 108, the vias 1031 and 1031' are surrounded by an insulating material so as to be electrically insulated from the second conductive material layer 108.

The integrated circuit 10 further comprises transistors formed on the semiconductor layer 116. The conductive channels of the transistors are all formed in the semiconductor layer 116 and the back-gates of the transistors are all formed from the third conductive material layer 112. As an example, the transistors comprise a transistor 113 of a first conductive type and a transistor 115 of a second conductive type. Preferably, the first conductive type is different from the second conductive type. A dielectric layer 118 covers the semiconductor layer 116 and the transistors.

The integrated circuit 10 further comprises first isolation structures 111 for electrically isolating each of the transistors, and a second isolation structure 111'. The lower surfaces of isolation structures 111 and 111' are flushed with the lower surface of the third insulating material layer 110, and the top surfaces of isolation structures 111 and 111' are flushed with or slightly higher than the upper surface of the semiconductor layer 116. Conductive contacts 117 for electrically connecting the second conductive material layer 108 to outside may penetrate through the dielectric layer 118 and the second isolation structure 111' to reach the upper surface of the second conductive material layer 108. Alternatively, the conductive contacts 117 may penetrate through the dielectric layer 118, the semiconductor layer 116, the insulating buried layer 114, the third conductive material layer 112 and the third insulating material layer 110 to reach the upper surface of the second conductive material layer 108, and at the same time, may be isolated from each of the transistors by means of the second isolation structure 111' and the first isolation structures 111.

The integrated circuit 10 further comprises a conductive contact 119 that penetrates through the dielectric layer 118, the semiconductor layer 116 and the insulating buried layer 114 to reach the third conductive material layer 112 so as to be electrically connected with the second group of vias 1031'. The conductive contact 119 is used for electrically connecting the first conductive material layer 104 to outside.

Of course, the integrated circuit 10 further comprises the top gate contact (not shown), the source/drain contact, etc. of each transistor. In this embodiment, the transistor of the first conductive type is, for example, an nMOSFET or pMOSFET; and the transistor of the second conductive type is, for example, a pMOSFET or nMOSFET accordingly.

In the integrated circuit 10 according to this embodiment, a voltage is applied to the back-gate (i.e. the third conductive material layer 112) of the transistor 113 of the first conductive type by means of the vias 107, the second conductive material layer 108 and the conductive contact 117; a voltage is applied to the back-gate (i.e. the third conductive material layer 112) of the transistor 115 of the second conductive type by means of the first group of vias 1031, the first conductive material layer 104, the second group of vias 1031' and the conductive contact 119. Thus it is unnecessary to separately make a back-gate contact for each of transistors 113 and transistors 115, which reduces the area occupied by a single device and increases the utilization ratio of the wafer.

It shall be noted herein that in other embodiments of the present invention, all of transistors 113 of the first conductive type or all of transistors 115 of the second conductive type can be replaced by a group of transistors which need to be applied with a specific back-gate voltage. In this case, it is unnecessary to define the conductive type of each group of transistors; that is to say, each group of transistors may not necessarily have the same conductive type, as long as the same back-gate voltage can be applied to each group of specific transistors without adding extra conductive contacts.

A method of manufacturing the integrated circuit 10 according to the first embodiment of the present invention will be described below.

Figure 2:
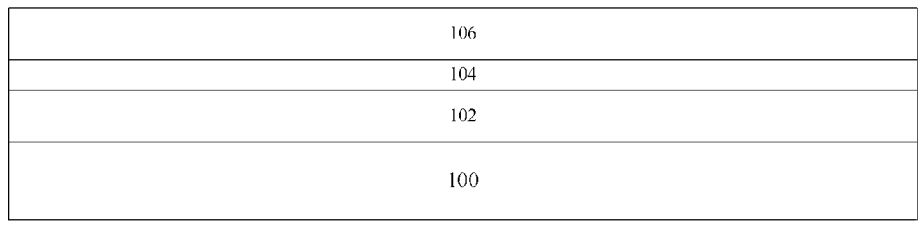
FIGS. 2-10 schematically show cross-sectional views of the respective stages of manufacturing the integrated circuit comprising transistors having back-gates according to the first embodiment of the present invention.

First, a first insulating material layer 102, a first conductive material layer 104 and a second insulating material layer 106 are sequentially deposited on a semiconductor base layer 100, as shown in FIG. 2.

Figure 3:
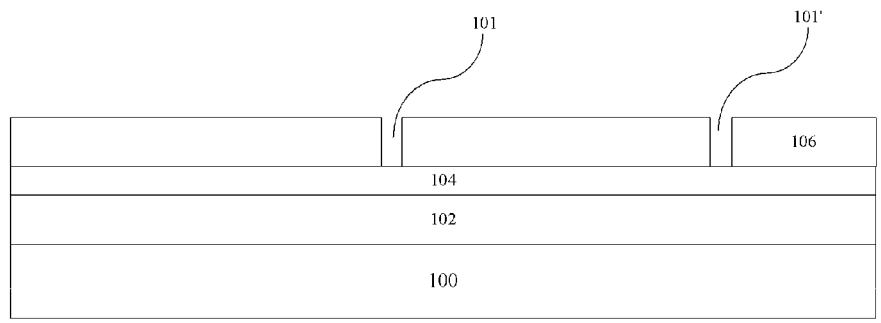

Then, the second insulating material layer 106 is patterned by means of the conventional photolithography and etching processes to form through holes 101 therein, as shown in FIG. 3. For purpose of simplicity, FIG. 3 shows only one through hole 101, but in fact, many through holes 101 may be formed, and each of the through holes 101 is located under a region in which a transistor of a first conductive type and having a back-gate is to be formed. Preferably, the transistor of the first conductive type is nMOSFET or pMOSFET. In addition, at least one additional through hole 101' is formed. Preferably, in the embodiment of the present invention, one additional through hole 101' is formed.

Figure 4:
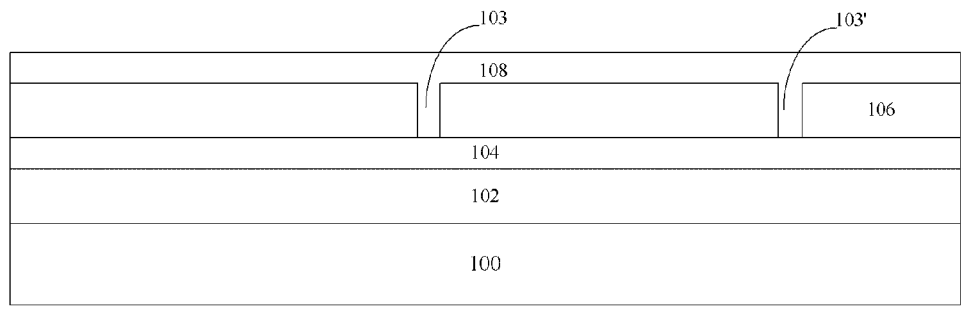

Next, a conductive material is deposited on the second insulating material layer 106 to form a second conductive material layer 108, so that the through holes 101 and 101' in the second insulating material layer 106 are also filled up with the conductive material of the second conductive material layer 108, so as to respectively form vias 103 and 103' between the first conductive material layer 104 and the second conductive material layer 108, as shown in FIG. 4.

Figure 5:
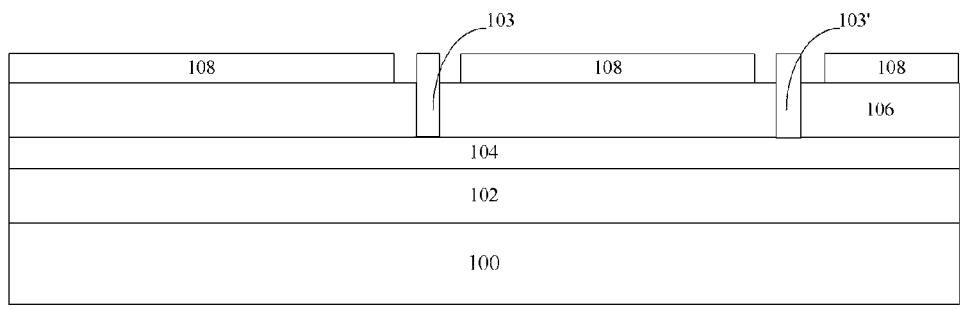
Figure 5A:
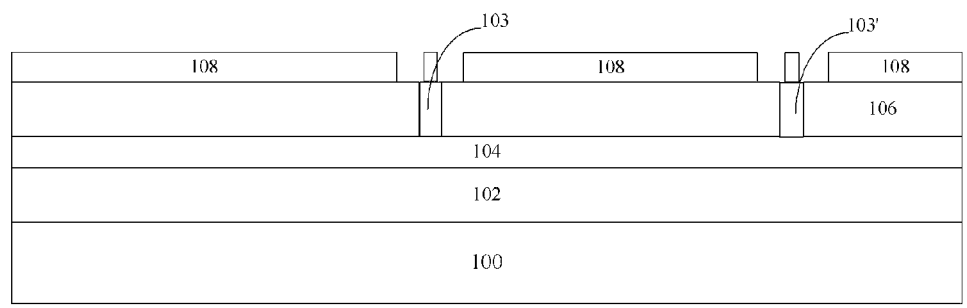
Figure 5B:
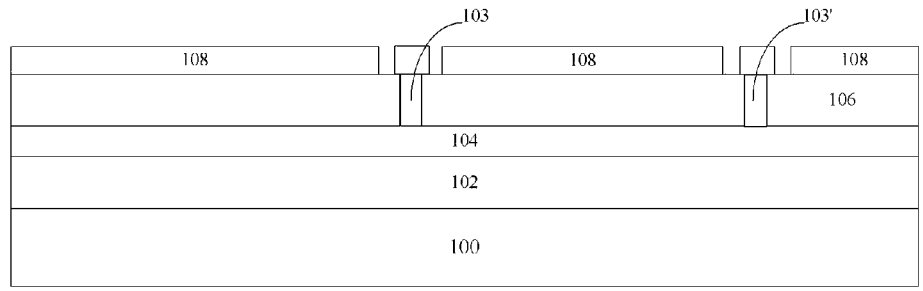
Figure 5C:
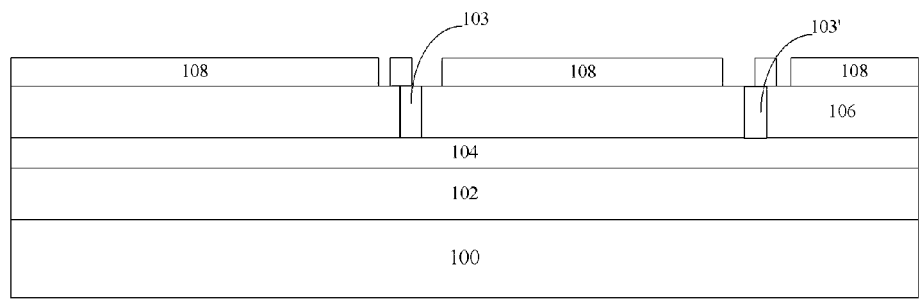

Then, the second conductive material layer 108 is patterned by means of the conventional photolithography and etching processes, so that at least a part of each of the vias 103 and 103' is covered by a part of the second conductive material layer 108, and that the part of the second conductive material layer 108 that covers at least a part of each of the vias 103 and 103' is separated from other parts of the second conductive material layer 108, as shown in FIG. 5. FIG. 5 shows that the parts of the second conductive material layer 108 remaining above the vias 103 and 103' have the same width as that of the vias 103 and 103', respectively. However, the present invention is not limited to this. In fact, the parts of the second conductive material layer 108 remaining above the vias 103 and 103' may have the narrower (as shown in FIG. 5a) or wider (as shown in FIG. 5b) width than that of the vias 103 and 103', respectively; or the parts of the second conductive material layer 108 remaining above the vias 103 and 103' may partially cover the vias 103 and 103' (as shown in FIG. 5c), respectively.

Figure 6:
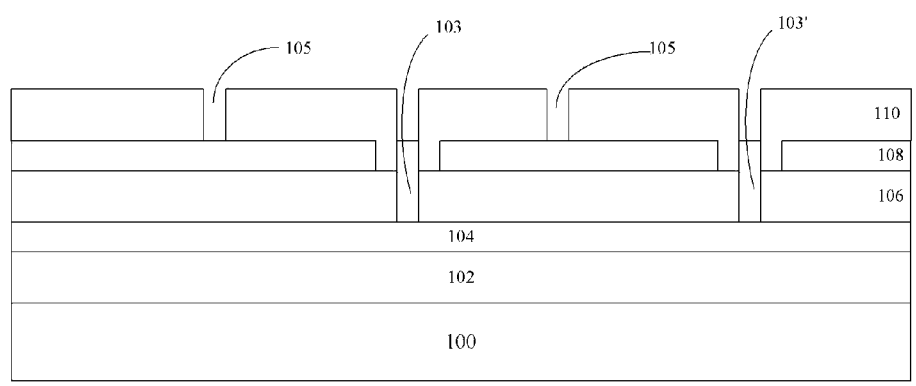

Subsequently, an insulating material is deposited on the second conductive material layer 108 to form a third insulating material layer 110, so that the insulating material of the third insulating material layer 110 fills up the space between the separated parts of the second conductive material layer. Then, the third insulating material layer 110 is patterned by means of conventional photolithography and etching techniques, so that parts of the second conductive material layer 108 remaining above the vias 103 and 103' are exposed and that a plurality of through holes 105 are formed, as shown in FIG. 6. Each of the through holes 105 is located under a region in which a transistor of a second conductive type and having a back-gate is to be formed. Preferably, the second conductive type is different from the first conductive type, namely, the transistor of the second conductive type is pMOSFET or nMOSFET. Preferably, the transistors of the first conductive type and the transistors of the second conductive type are arranged alternately.

Figure 7:
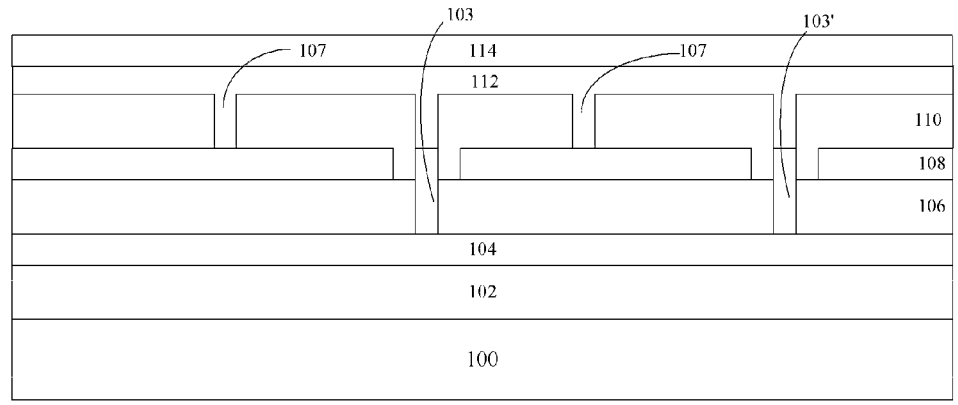

Next, a conductive material is deposited on the third insulating material layer 110 to form a third conductive material layer 112. Meanwhile, the parts of the third insulating material layer 110 that have been removed by etching are also filled up with the conductive material, so that vias 107 are formed at the position of the through holes 105, and that vias are formed at the positions of the exposed parts above the vias 103 and 103', which, together with the vias 103 and 103', electrically connect the first conductive material layer 104 to the third conductive material layer 112, as shown in FIG. 7. The third conductive material layer 112 can be used for forming the back-gates of the transistors in the subsequent processes.

Figure 8:
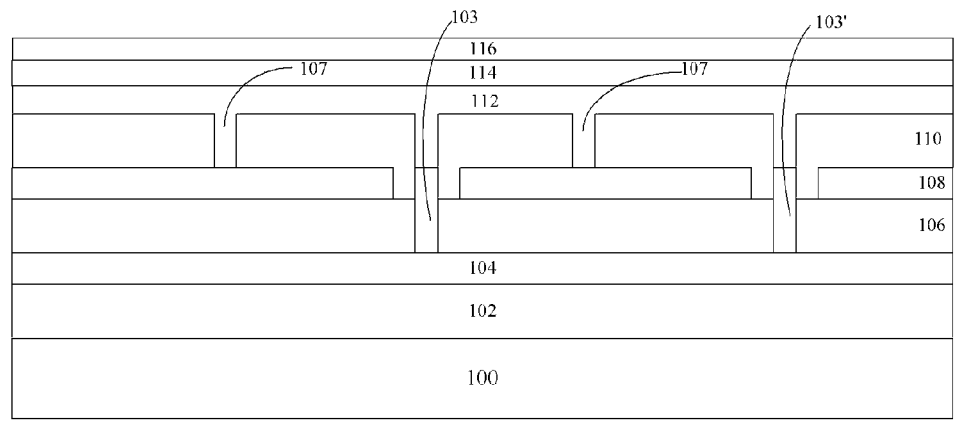

Then, an insulating buried layer 114 is deposited on the third conductive material layer 112, as shown in FIG. 7. Preferably, the insulating buried layer 114 is a thin oxide layer. Afterwards, a semiconductor layer 116 is formed onto the insulating buried layer 114, as shown in FIG. 8. Specifically, the semiconductor layer 116 can be formed onto the insulating buried layer 114 by means of, for example, the SmartCut™ technique, thereby forming a Semiconductor-On-Insulator (SOI) structure.

Figure 9:
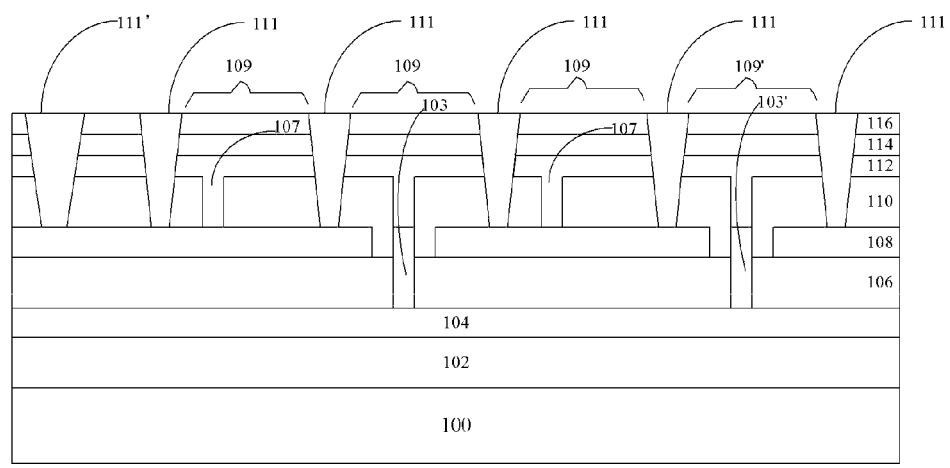

Alternatively, after forming the semiconductor layer 116 onto the insulating buried layer 114, a plurality of first isolation structures 111 and second insulation structures 111' are formed by means of processes well known in the art. Preferably, both the first isolation structures 111 and second insulation structures 111' are shallow trench isolation (STI) structures. Preferably, the number of the second insulation structures 111' is one. The bottom surfaces of the isolation structures 111 and 111' are flushed with the lower surface of the third insulating material layer 110, and the top surfaces of the isolation structures 111 and 111' are flushed with or slightly higher than the upper surface of the semiconductor layer 116. A region 109 in which the transistors are to be formed is located between adjacent first isolation structures 111, and the via above the via 103' is isolated from the vias above the vias 107 and vias 103 by means of the first insulation structures 111. As an example, as shown in FIG. 9, the via 103' is located between two adjacent first isolation structures 111, i.e., in the area 109'.

Before or after forming the first isolation structures 111 and the second isolation structures 111', the third conductive material layer 112 may have a low resistance by ion implantation therein so as to form a back-gate structure.

Figure 10:
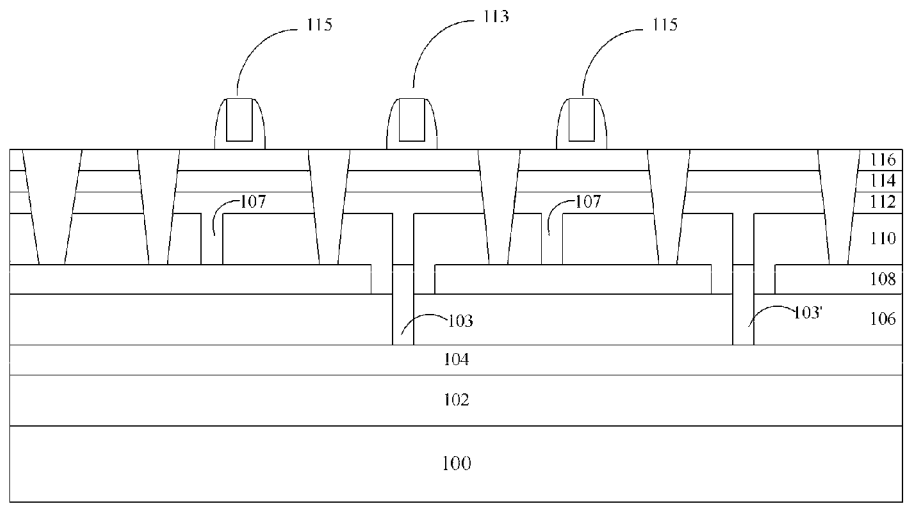

The method of manufacturing the integrated circuit comprising transistors having back-gates according to the first embodiment of the present invention, in addition to the above-described steps for forming the semiconductor substrate, further comprises the steps of forming transistors 113 of a first conductive type in the corresponding area 109 above the vias 103; and forming transistors 115 of a second conductive type in the corresponding area 109 above the vias 107, as shown in FIG. 10. The processes for forming the transistors are known in the art, so in order to highlight the features and advantages of the present invention, such processes will not be described in details herein. Then, a dielectric layer 118 which covers the transistors of the first and second conductive types and the formed semiconductor substrate and a top gate contact (not shown in the figure) and a source/drain contact of each transistor are formed by means of the processes well known in the art. Moreover, a conductive contact 117 penetrating through the dielectric layer 118 and the second isolation structure 111' is formed by means of the processes well known in the art, which connects the second conductive material layer 108 to outside. Thus, the conductive contact 117 is embedded into the second isolation structure 111' and connects the back-gates (i.e. the third conductive material layer 112) of some or all of the transistors 113 of the first conductive type to outside via the second conductive material layer 108. Further, a conductive contact 119 is formed in the corresponding area 109' above the via 103', which penetrates through the dielectric layer 118, the semiconductor layer 116 and the insulating buried layer 114 and is electrically connected with the via 103' so as to connect the first conductive material layer 104 to outside, thus the conductive contact 119 can connect the back-gates (i.e. the third conductive material layer 112) of some or all of the transistors 115 of the second conductive type to outside via the first conductive material layer 104, as shown in FIG. 1.

Although in the embodiment as shown, the conductive contact 117 is formed in the second isolation structure 111', the present invention is not limited to this, and those skilled in the art can form the conductive contact 117 at any suitable position in any appropriate way, as long as it can electrically connect the second conductive material layer 108 to outside. For example, the conductive contact 117 may also be formed between the isolation structures to penetrate through the dielectric layer 118, the semiconductor layer 116, the insulating buried layer 114, the third conductive material layer 112 and the third insulating material layer 110 to reach the second conductive material layer 108. Before forming the conductive contacts 117 and/or 119, a contact lining layer may also be formed from, for example, Ti, TiN, or a combination thereof.

Second Embodiment

In the first embodiment described above, the back-gates of the transistors of the first and second conductive types are all connected to outside through the conductive material layer thereunder, but the present invention is not limited to this, it also allows the back-gates of only transistors of the first conductive type or the back-gates of only transistors of the second conductive type to be connected to outside through the conductive material layer thereunder.

Figure 11:
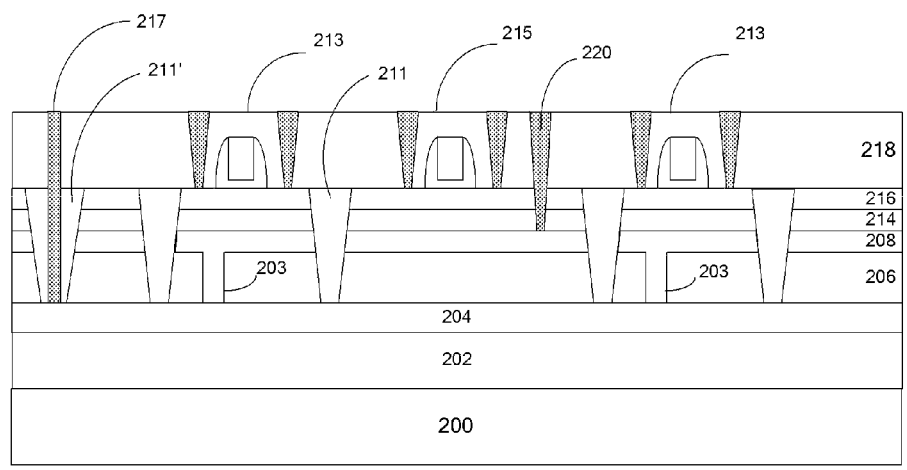
FIG. 11 schematically shows a cross-sectional view of an integrated circuit comprising transistors having back-gates according to a second embodiment of the present invention.

FIG. 11 shows a schematic cross-sectional view of an integrated circuit 20 comprising transistors having back-gates according to a second embodiment of the present invention.

The integrated circuit 20 comprises: a semiconductor base layer 200; a first insulating material layer 202 on the semiconductor base layer 200; a first conductive material layer 204 on the first insulating material layer 202; a second insulating material layer 206 on the first conductive material layer 204; a second conductive material layer 208 on the second insulating material layer 206; an insulating buried layer 214 on the second conductive material layer 208; a semiconductor layer 216 formed on the insulating buried layer 214.

The integrated circuit 20 further comprises vias 203 penetrating through the second insulating material layer 206 to electrically connect the second conductive material layer 208 with the first conductive material layer 204. The vias 203 are located under areas in which the corresponding transistors are to be formed.

The integrated circuit 20 further comprises transistors formed on the semiconductor layer 216. The conductive channels of the transistors are all formed in the semiconductor layer 216 and the back-gates of the transistors are all formed from the second conductive material layer 208. As an example, the transistors comprise transistors 213 of a first conductive type and transistors 215 of a second conductive type. Preferably, the first conductive type is different from the second conductive type. A dielectric layer 218 covers the semiconductor layer 216 and the transistors.

The integrated circuit 20 further comprises first isolation structures 211 for electrically isolating each of the transistors, and second isolation structures 211'. The lower surfaces of isolation structures 211 and 211' are flushed with the lower surface of the second insulating material layer 206, and the top surfaces of isolation structures 211 and 211' are flushed with or slightly higher than the upper surface of the semiconductor layer 216. A conductive contact 217 for electrically connecting the first conductive material layer 204 to outside may penetrate through the dielectric layer 218 and the second isolation structures 211' to reach the upper surface of the first conductive material layer 204. Alternatively, the conductive contact 217 may penetrate through the dielectric layer 218, the semiconductor layer 216, the insulating buried layer 214, the second conductive material layer 208 and the second insulating material layer 206 to reach the upper surface of the first conductive material layer 204, and at the same time, may be isolated from each of the transistors by means of the second isolation structures 211' and the first isolation structures 211.

In the case where the first conductive material layer 204 is electrically connected to outside through the conductive contact 217, since the back-gates (i.e. the second conductive material layer 208) of the transistors 213 of the first conductive type are electrically connected with the first conductive material layer 204, the back-gate voltages of the transistors 213 can be controlled by means of the conductive contact 217 by applying a voltage from outside. Thus it is unnecessary to separately make a back-gate contact for each of the transistors 213, which reduces the area occupied by a single device and increases the utilization ratio of the wafer. As for the transistors 215 whose back-gate voltages are not applied through the conductive contact 217, their back-gate contacts can be made by means of the conventional techniques (as exemplarily shown in FIG. 11 with respect to the transistors 215 of the second conductive type), and this will not be described in detail any more because it is well known to those skilled in the art.

Of course, the integrated circuit 20 further comprises the top gate contact (not shown), the source/drain contact, etc. of each transistor. In this embodiment, the transistor of the first conductive type is, for example, an nMOSFET or pMOSFET; and the transistor of a second conductive type is, for example, a pMOSFET or nMOSFET, accordingly.

It shall be noted herein that in other embodiments of the present invention, all of transistors 213 of the first conductive type can be replaced by a group of transistors which need to be applied with a specific back-gate voltage. In this case, it is unnecessary to define the conductive type of the group of transistors; that is to say, the group of transistors may not necessarily have the same conductive type, as long as the same back-gate voltage can be applied to the group of specific transistors without adding extra conductive contacts.

A method of manufacturing the integrated circuit 20 according to the second embodiment of the present invention will be described below.

Figure 12:
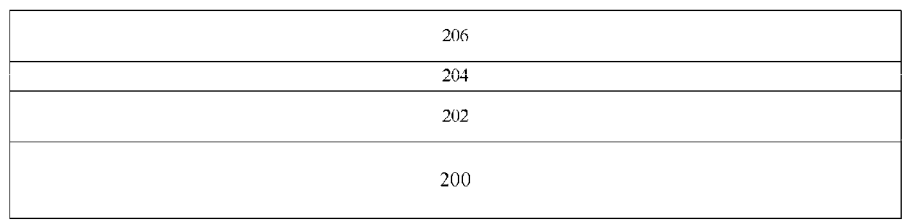
FIGS. 12-16 schematically show cross-sectional views of the respective stages of manufacturing the integrated circuit comprising transistors having back-gates according to the second embodiment of the present invention.

First, a first insulating material layer 202, a first conductive material layer 204 and a second insulating material layer 206 are sequentially deposited on a semiconductor base layer 200, as shown in FIG. 12.

Figure 13:
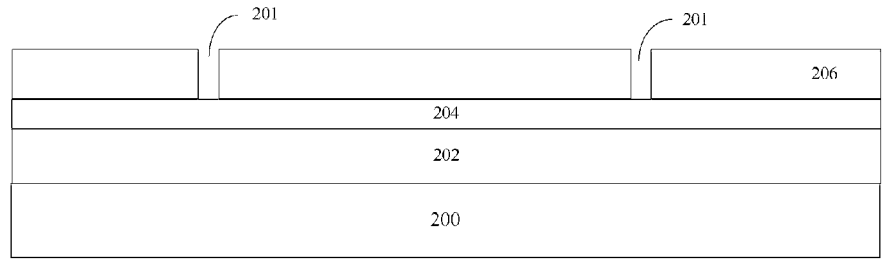

Then, the second insulating material layer 206 is patterned by means of the conventional photolithography and etching processes to form through holes 201 therein, as shown in FIG. 13. Each of the through holes is located under a region in which a transistor of a first conductive type and having a back-gate is to be formed. Preferably, the transistor of the first conductive type is nMOSFET or pMOSFET.

Figure 14:
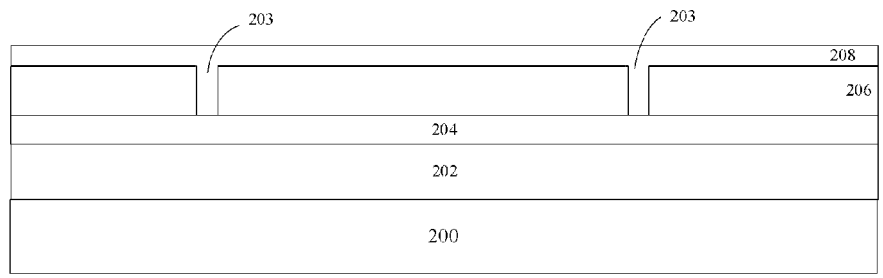

Next, a conductive material is deposited on the second insulating material layer 206 to form a second conductive material layer 208, so that the through holes 201 formed in the second insulating material layer 206 are also filled up with the conductive material of the second conductive material layer 208, so as to form a plurality of conductive vias 203 between the first conductive material layer 204 and the second conductive material layer 208, as shown in FIG. 14. The second conductive material layer 208 may be used for forming the back-gates of the transistors in the subsequent processes.

Figure 15:
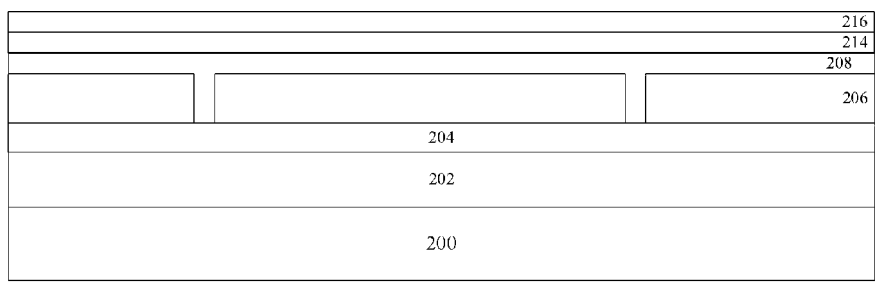

Subsequently, an insulating buried layer 214 is deposited on the second conductive material layer 208. Preferably, the insulating buried layer 214 is a thin oxide layer. Afterwards, a semiconductor layer 216 is formed onto the insulating buried layer 214, as shown in FIG. 15. Specifically, the semiconductor layer 216 can be formed onto the insulating buried layer 214 by means of, for example, the SmartCut™ technique, thereby forming a Semiconductor-On-Insulator (SOI) structure.

Figure 16:
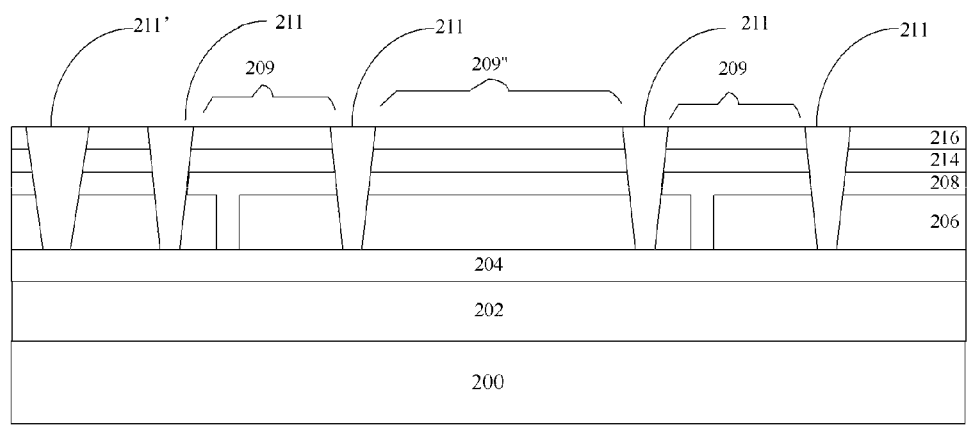

Alternatively, after forming the semiconductor layer 216 onto the insulating buried layer 214, a plurality of first isolation structures 211 and second insulation structures 211' are formed by means of processes well known in the art. Preferably, both the first isolation structures 211 and second insulation structures 211' are STI structures. The bottom surfaces of the isolation structures 211 and 211' are flushed with the lower surface of the second insulating material layer 206, and the top surfaces of the isolation structures 211 and 211' are flushed with or slightly higher than the upper surface of the semiconductor layer 216. A region 209 in which the transistors of the first conductive type are to be formed is located between adjacent first isolation structures 211, and a region 209" in which the transistors of the second conductive type are to be formed is located between the neighboring areas 209. The area 209" is also located between adjacent first isolation structures 211, as shown in FIG. 16. Preferably, the second conductive type is different from the above-mentioned first conductive type, namely, the transistor of the second conductive type is pMOSFET or nMOSFET. Preferably, the transistors of the first conductive type and the transistors of the second conductive type are arranged alternately.

Before or after forming the first isolation structures 211 and the second isolation structures 211', the second conductive material layer 208 may have a low resistance by ion implantation therein so as to form a back-gate structure.

The method of manufacturing the integrated circuit comprising transistors having back-gates according to the second embodiment of the present invention, in addition to the above-described steps for forming the semiconductor substrate, further comprises the steps of forming transistors 213 of a first conductive type in the area 209; and forming transistors 215 of a second conductive type in the area 209". The processes for forming the transistors are known in the art, so in order to highlight the features and advantages of the present invention, such processes will not be described in details herein.

Then, a dielectric layer 218 which covers the transistors of the first and second conductive types and the formed semiconductor substrate and a top gate contact (not shown in the figure) and a source/drain contact of each transistor are formed by means of the processes well known in the art. Moreover, a conductive contact 217 penetrating through the dielectric layer 218 and the second isolation structure 211' is formed by means of the processes well known in the art, which connects the first conductive material layer 204 to outside. Thus, the conductive contact 217 is embedded into the second isolation structure 211' and connects the back-gates (i.e. the second conductive material layer 208) of some or all of the transistors 213 of the first conductive type to outside via the first conductive material layer 204. Further, a conductive contact 220 penetrating through the dielectric layer 218, the semiconductor layer 216 and the insulating buried layer 214 to reach the second conductive material layer 208 is formed in a region which is defined by adjacent first isolation structures 211 and in which each of the transistors 215 of the second conductive type is located, as shown in FIG. 11. For purpose of simplicity, FIG. 11 only shows one transistor 215 of the second conductive type and one corresponding conductive contact 220; but in fact, there may be a plurality of transistors 215 of the second conductive type and corresponding conductive contacts 220. Each of the conductive contacts 220 is used for connecting the back-gate (i.e. the second conductive material layer 208) of a corresponding one of the transistors of the second conductive type to outside.

Although in the embodiment as shown, the conductive contact 217 is formed in the second isolation structure 211', the present invention is not limited to this, and those skilled in the art can form the conductive contact 217 at any suitable position in any appropriate way, as long as it can electrically connect the first conductive material layer 204 to outside. For example, the conductive contact 217 may also be formed between the isolation structures to penetrate through the dielectric layer 218, the semiconductor layer 216, the insulating buried layer 214, the second conductive material layer 208 and the second insulating material layer 206 to reach the first conductive material layer 204. Before forming the conductive contacts 217, a contact lining layer may also be formed from, for example, Ti, TiN, or a combination thereof.

It shall be noted that in the present invention, the expression of "first", "second", "third", "fourth", etc. used before the technical terms is not intended to limit the technical terms, but they are only used for differentiating the technical terms. In addition, in order to facilitate the description, the transistors in the present invention are divided into the first conductive type and the second conductive type, one same back-gate voltage is applied to transistors of the first conductive type, while another same back-gate voltage is applied to transistors of the second conductive type. However, the present invention is not limited to this, and one conductive contact can be used to connect the back-gates of some transistors of different conductive types to outside as desired, i.e., the same voltage is applied to the back-gates of some transistors of different conductive types, while another conductive contact can be used to connect the back-gates of some other transistors of different conductive types to outside. That is, the transistors whose back-gate voltages need to be controlled can be grouped in the present invention according to the requirement of the device.

Processes and Materials

In the embodiments described above, the layers involved may be deposited by means of Chemical Vapor Deposition (CVD), Physical Vapor Deposition (PVD), Pulsed Laser Deposition (PLD), Atomic Layer Deposition (ALD), Plasma Enhanced Atomic Layer Deposition (PEALD) or other appropriate processes as well known in the art. The photolithography and etching processes involved may be performed by Reactive Ion Etching (RIE), Electron Cyclotron Resonance (ECR) etching, Inductive Coupling Plasma (ICP) etching, etc. as well known in the art. The semiconductor substrates 100 and 200 involved are preferably silicon wafers. Of course, any other suitable substrates may be used as required. The first, second and third insulating material layers are preferably oxide layers. The first, second and third conductive material layers are preferably polysilicon layers, and can be made to have a low resistance through ion implantation in which n-type ion doping may be performed by using, for example, As and P, or p-type ion doping may be performed by using, for example, In and B, with the doping concentration being usually $10^{18} \sim 10^{21}$ cm$^{-3}$. The material of the semiconductor layers 116 and 216 may include one of Si, SiGe, SiC and SiGeC, or any combination thereof. The isolation material of the isolation structures may be oxide, nitride or a combination thereof. The material forming the conductive contacts 111, 211 and 211' can be, but not limited to, Cu, Al, W, polysilicon, or a combination thereof.

While the invention has been described in detail by means of the various exemplary embodiments, it will be understood by those skilled in the art that many replacements and variants can be made to the present invention without departing from the spirit and scope of the present invention as defined by the appended claims.

What is claimed is:

1. A semiconductor substrate for manufacturing transistors having back-gates thereon, comprising:
   a semiconductor base layer;
   a first insulating material layer on the semiconductor base layer;
   a first conductive material layer on the first insulating material layer;
   a second insulating material layer on the first conductive material layer;
   a second conductive material layer on the second insulating material layer;
   an insulating buried layer on the second conductive material layer;
   a semiconductor layer on the insulating buried layer,
   a plurality of first isolation structures, the bottom surfaces of the first isolation structures being flushed with the lower surface of the second insulating material layer, and the top surfaces of the first isolation structures being flushed with or slightly higher than the upper surface of the semiconductor layer,
   wherein at least one first conductive via is provided between the first conductive material layer and the second conductive material layer to penetrate through the second insulating material layer so as to connect the first conductive material layer with the second conductive material layer, the position of each of the first conductive vias being defined by a region in which a corresponding one of a first group of transistors is to be formed; and
   wherein each of the areas in which transistors having back-gates are to be formed is defined by adjacent first isolation structures.

2. The semiconductor substrate according to claim 1, wherein the semiconductor layer includes one of Silicon-On-Insulator, Silicon-Germanium-On-Insulator, Silicon-Carbide-On-Insulator, and Silicon-Germanium-Carbon-On-Insulator, or any combination thereof.

3. The semiconductor substrate according claim 1, wherein both the first conductive material layer and the second conductive material layer are doped polysilicon layers.

4. An integrated circuit having the semiconductor substrate according to claim 1, comprising:
   transistors located in the area in which transistors having back-gates are to be formed, the transistors comprising a first group of transistors and a second group of transistors, the conductive channels of the transistors being in the semiconductor layer, and the back-gates of the transistors being formed from the second conductive material layer;
   a dielectric layer covering the semiconductor substrate and the transistors; and
   a conductive contact for electrically connecting the back-gates of the first group of transistors to outside by electrically connecting the first conductive material layer to outside.

5. The integrated circuit according to claim 4, wherein the conductive contact is located between adjacent first isolation structures and penetrates through the dielectric layer, the semiconductor layer, the insulating buried layer, the second conductive material layer and the second insulating material layer to reach the first conductive material layer.

6. The integrated circuit according to claim 4, wherein the semiconductor substrate further comprises a plurality of second isolation structures, the bottom surfaces of which are flushed with the lower surface of the second insulating material layer, and the top surfaces of which are flushed with or slightly higher than the upper surface of the semiconductor layer, and
   wherein the conductive contact penetrates through the dielectric layer and one of the second isolation structures and is embedded into the one of the second isolation structures.

7. The integrated circuit according to claim 4, wherein the first group of transistors and the second group of transistors are pMOSFETs and nMOSFET, respectively, or are nMOSFETs and pMOSFETs, respectively.

8. The integrated circuit according to claim 4, wherein the conductive contact is formed of Cu, Al, W, or polysilicon.

9. The semiconductor substrate according to claim 1, further comprising:
   another conductive material layer between the first insulating material layer and the first conductive material layer; and
   another insulating material layer between the another conductive material layer and the first conductive material layer, wherein a plurality of second conductive vias are provided between the second conductive material layer and the another conductive material layer to penetrate through the another insulating material layer, the first conductive material layer and the second insulating material layer so as to connect the second conductive material layer with the another conductive material layer, the second conductive vias being electrically insulated from the first conductive material layer; and
   wherein the plurality of second conductive vias are divided into a first group and a second group, the first group including one second conductive via, and each of the second conductive vias in the second group is defined by a region in which a corresponding one of transistors of a second conductive type is to be formed.

10. The semiconductor substrate according to claim 9, wherein around the second conductive vias, the second insulating material layer extends downwards to be embedded into the first conductive material layer so as to electrically insulating the second conductive vias from the first conductive material layer.

11. The semiconductor substrate according to claim 10, further comprising:
a plurality of first isolation structures, the bottom surfaces of the first isolation structures being flushed with the lower surface of the second insulating material layer, and the top surfaces of the first isolation structures being flushed with or slightly higher than the upper surface of the semiconductor layer, wherein each of the areas in which transistors having back-gates are to be formed is defined by adjacent first isolation structures.

12. An integrated circuit having the semiconductor substrate according to claim 10, comprising:
transistors located in the region in which transistors having back-gates are to be formed, the transistors comprising a first group of transistors and a second group of transistors, the conductive channels of the transistors being in the semiconductor layer and the back-gates of the transistors being formed from the second conductive material layer;
a dielectric layer covering the semiconductor substrate and the transistors;
a first conductive contact for electrically connecting the back-gates of the first group of transistors to outside by electrically connecting the first conductive material layer to outside; and
a second conductive contact penetrating through the dielectric layer, the semiconductor layer and the insulating buried layer to reach the second conductive material layer so as to be electrically connected with the first group of transistors.

13. The integrated circuit according to claim 12, wherein the first conductive contact is located between adjacent first isolation structures and penetrates through the dielectric layer, the semiconductor layer, the insulating buried layer, the second conductive material layer and the second insulating material layer to reach the first conductive material layer.

14. The integrated circuit according to claim 12, wherein the semiconductor substrate further comprises a second isolation structure, the bottom surface of which is flushed with the lower surface of the second insulating material layer, and the top surface of which is flushed with or slightly higher than the upper surface of the semiconductor layer, and wherein the first conductive contact penetrates through the dielectric layer and one of the second isolation structures, and is embedded into the one of the second isolation structures.

15. The integrated circuit according to claim 12, wherein the first group of transistors and the second group of transistors are pMOSFETs and nMOSFET, respectively, or are nMOSFETs and pMOSFETs, respectively.

16. The integrated circuit according claim 12, wherein the conductive contact is formed of Cu, Al, W, or polysilicon.

17. A method of manufacturing a semiconductor substrate, the semiconductor substrate being used for manufacturing transistors with back-gates thereon, the method comprising:
providing a semiconductor base layer;
sequentially forming a first insulating material layer, a first conductive material layer and a second insulating material layer on the semiconductor base layer;
patterning the second insulating material layer to form at least one through hole penetrating through the second insulating material layer, the position of each of the through holes being defined by a region in which a corresponding one of the first group of transistors are to be formed;
depositing a conductive material on the second insulating material layer to form a second conductive material layer, so that each of the through holes is filled up with the conductive material of the second conductive material layer to form a conductive via; depositing an insulating buried layer on the second conductive material layer; and forming a semiconductor layer on the insulating buried layer;
forming a plurality of first isolation structures, the bottom surfaces of the first isolation structures being flushed with the lower surface of the second insulating material layer, and the top surfaces of the first isolation structures being flushed with or slightly higher than the upper surface of the semiconductor layer,
wherein each of the areas in which transistors having back-gates are to be formed is defined by adjacent first isolation structures.

18. A method of manufacturing a semiconductor substrate, the semiconductor substrate being used for manufacturing transistors with back-gates thereon, the method comprising the steps of:
providing a semiconductor base layer;
sequentially forming a first insulating material layer, a first conductive material layer and a second insulating material layer on the semiconductor base layer;
patterning the second insulating material layer to form a plurality of first through holes penetrating through the second insulating material layer, the first through holes being divided into a first group and a second group, wherein the first group includes one first through hole, and the position of each of the first through holes in the second group is defined by a region in which a corresponding one of a first group of transistors are to be formed;
depositing a conductive material on the second insulating material layer to form a second conductive material layer, so that each of the first through holes is filled up with the conductive material of the second conductive material layer to form a plurality of first conductive vias;
patterning the second conductive material layer, so that at least a part of each of the first conductive vias is covered by a part of the second conductive material layer, and that the part of the second conductive material layer covering at least a part of each of the first conductive vias is separated from other parts of the second conductive material layer;
depositing an insulating material on the second conductive material layer to form a third insulating material layer, so that the insulating material of the third insulating material layer fills up the space between the separated parts of the second conductive material layer;
patterning the third insulating material layer, so that part of the second conductive material layer remaining above the first conductive vias is exposed and that a plurality of second through holes are formed, the position of each of the second through holes being defined by a region in which a corresponding one of the second group of transistors are to be formed;
depositing a conductive material on the third insulating material layer to form a third conductive material layer, so that the second through holes are filled up with the conductive material of the third conductive material layer to form second conductive vias, and that the exposed part on the second conductive material layer remaining above the first conductive vias is filled up with the conductive material of the third conductive material layer to form a third conductive via;

depositing an insulating buried layer on the third conductive material layer; and forming a semiconductor layer on the insulating buried layer.

19. The method according to claim 18, further comprising:

forming a plurality of first isolation structures, the bottom surfaces of the first isolation structures being flushed with the lower surface of the second insulating material layer, and the top surfaces of the first isolation structures being flushed with or slightly higher than the upper surface of the semiconductor layer, and wherein each of the areas in which transistors having back-gates are to be formed is defined by adjacent first isolation structures.

* * * * *